United States Patent [19]

Verheyen et al.

[11] Patent Number: 5,130,598

[45] Date of Patent: Jul. 14, 1992

[54] APPARATUS FOR DRIVING A PIEZOELECTRIC ACTUATOR

[75] Inventors: Michael R. Verheyen; James A. Antone; Liliana Grajales, all of Peoria, Ill.

[73] Assignee: Caterpillar Inc., Peoria, Ill.

[21] Appl. No.: 629,063

[22] Filed: Dec. 14, 1990

Related U.S. Application Data

[63] Continuation of Ser. No. 520,480, May 8, 1990, abandoned.

[51] Int. Cl.$^5$ ............................................ H01L 41/08
[52] U.S. Cl. .................................. 310/316; 310/317; 310/319
[58] Field of Search .................... 310/316, 317, 319

[56] References Cited

U.S. PATENT DOCUMENTS

| | | | |
|---|---|---|---|
| 3,500,799 | 3/1970 | Benson | 123/32 |
| 4,333,434 | 6/1982 | Brunais et al. | 123/478 |
| 4,469,974 | 9/1984 | Speranza | 310/316 |
| 4,481,554 | 11/1984 | Henricks et al. | 361/152 |
| 4,499,878 | 2/1985 | Igashira et al. | 123/478 |
| 4,520,289 | 5/1985 | Sato et al. | 310/316 |
| 4,535,743 | 8/1985 | Igashira et al. | 123/472 |
| 4,537,353 | 8/1985 | Speranza | 239/102 |
| 4,568,849 | 2/1986 | Sato et al. | 310/316 |
| 4,604,675 | 8/1986 | Pflederer | 361/155 |
| 4,644,212 | 2/1987 | Moritugu et al. | 310/317 |
| 4,658,155 | 4/1987 | Ohba et al. | 307/154 |
| 4,659,886 | 4/1987 | Igashira et al. | 123/498 |
| 4,680,667 | 7/1987 | Petrie | 361/154 |
| 4,688,536 | 8/1987 | Mitsuyasu et al. | 123/490 |
| 4,732,129 | 3/1988 | Takigawa et al. | 123/478 |
| 4,767,959 | 8/1988 | Sakakibara et al. | 310/317 |
| 4,841,191 | 6/1989 | Takata et al. | 310/316 |
| 4,845,419 | 7/1989 | Hacker | 320/39 |
| 4,947,074 | 8/1990 | Suzuki | 310/316 |

FOREIGN PATENT DOCUMENTS 0324450 7/1989 European Pat. Off.

OTHER PUBLICATIONS

SAE Technical Paper Series 800502, by C. G. O'Neill et al., published 1980.
Japanese Patent Abstract vol. 9, No. 142 (M-388) Jun. 18, 1985 & JP, A, 6022050 (Nissan Jidosha K.K.) Feb. 4, 1985.
Japanese Patent Abstract vol. 10, No. 204 (M-499) Jul. 17, 1986 & JP, A, 6146441 (Nippon Soken Inc.) Mar. 6, 1986.

*Primary Examiner*—Mark O. Budd
*Assistant Examiner*—Thomas M. Dougherty
*Attorney, Agent, or Firm*—David M. Masterson

[57] ABSTRACT

An apparatus is provided for controllably connecting and disconnecting a piezoelectric actuator to and from an energy source to effect the displacement of a piezoelectric actuator for a fuel injector. Precise control of the timing and duration of the piezoelectric actuator is necessary to ensure that a proper quantity of fuel is delivered to each cylinder of an internal combustion engine. A charging and discharging means monitors the voltage level of the piezoelectric actuator, and the charging and discharging current of the piezoelectric actuator. Further, a smoothing means aids in leveling the charging and discharging current to better approximate a constant current to control the piezoelectric actuator providing a precise quantity of fuel to be delivered.

22 Claims, 4 Drawing Sheets

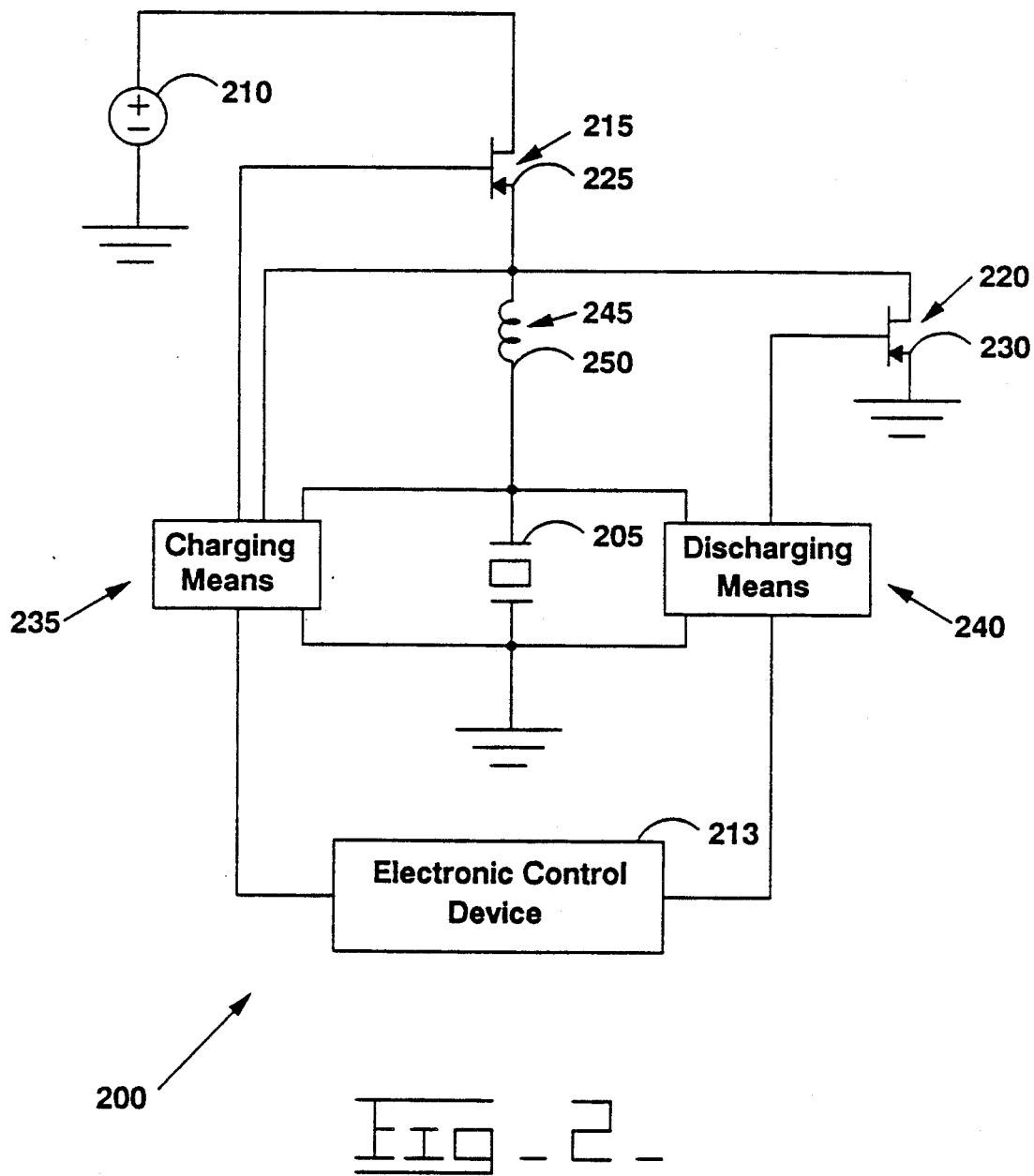
Fig_2_

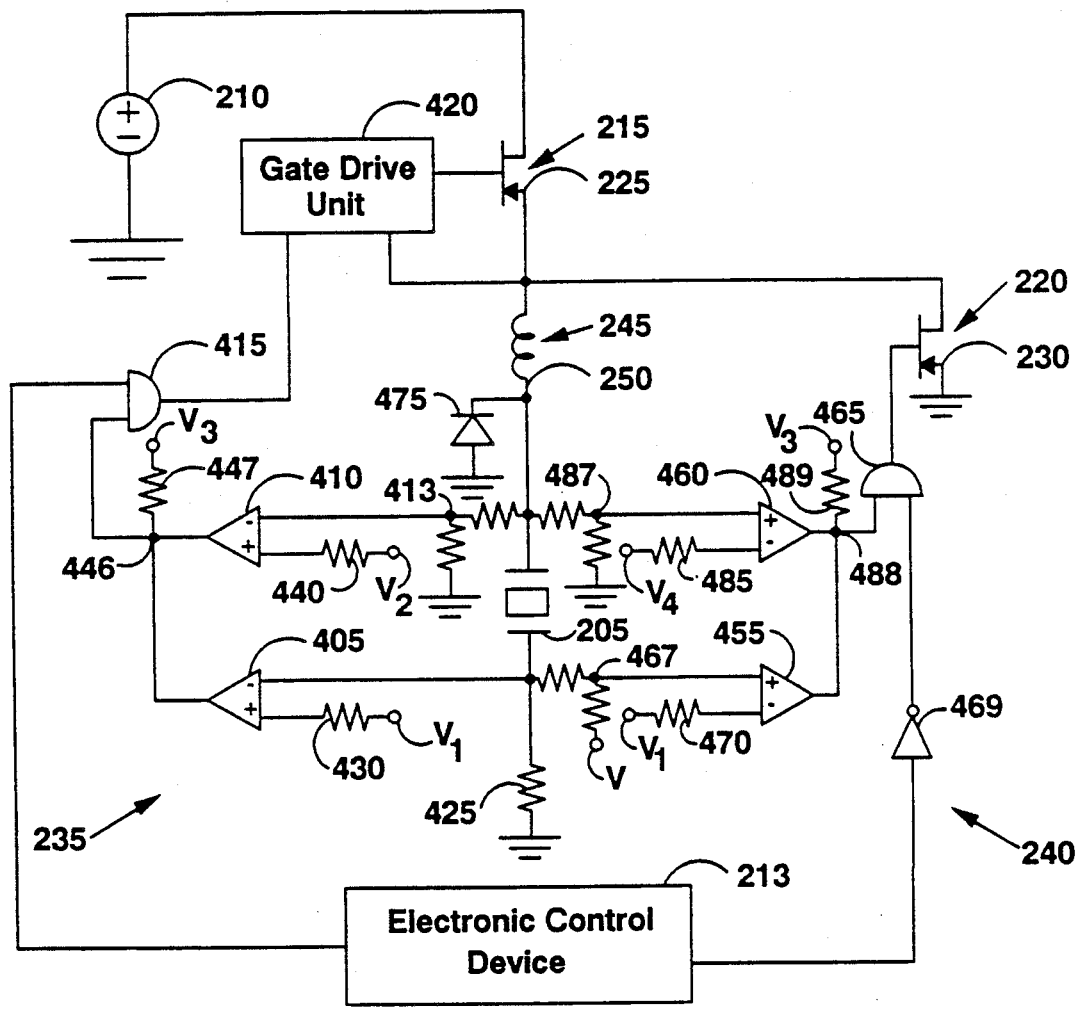
Fig_4_

APPARATUS FOR DRIVING A PIEZOELECTRIC ACTUATOR

This is a file wrapper continuation of application Ser. No. 07/520,480, filed May 8, 1990 now abandoned.

TECHNICAL FIELD

This invention relates generally to an apparatus for driving a piezoelectric actuator, and more particularly, to an apparatus for driving a piezoelectric actuator for a fuel injection system of an internal combustion engine.

BACKGROUND ART

The use of a piezoelectric actuator as a means for converting electric power into mechanical power is known. For instance, such a piezoelectric actuator may be conveniently used to control a fuel injection valve. This is advantageous, since a piezoelectric actuator has a faster response than a conventional electromagnetic solenoid. Accordingly, control of the fuel injection valve is performed by utilizing the responsive characteristics of the piezoelectric actuator.

It is necessary to provide a drive circuit for controlling the piezoelectric actuator by supplying a voltage to the actuator. Since a piezoelectric actuator requires a relatively high drive voltage, a power source which can supply a sufficiently high voltage is required. When such a high voltage power source is not used, a drive circuit which can boost the drive voltage to the required high level is required. The latter is the conventional approach.

Conventional piezoelectric driver circuits use a LC frequency design. This type of design "matches" an inductor to a capacitor to obtain a voltage doubling effect. For example, a conventional drive circuit is explained below.

Referring to FIG. 1 $V_S$ represents the direct current voltage source, $C_1$ a charging capacitor, $C_2$ a discharging capacitor, $L_1$ an inductor used at the time of charging, $L_2$ an inductor used at the time of discharging, $S_1$ a charging thyristor, $S_2$ a discharging thyristor, D a diode for clamping, and PZT a piezoelectric actuator. When a trigger pulse is input to a gate $G_1$ of the charging thyristor $S_1$, the charging thyristor $S_1$ is turned "on" and the piezoelectric actuator PZT is charged. In this case, since a resonant circuit is formed by the charging capacitor $C_1$, the charging inductor $L_1$, the charging thyristor $S_1$, and the piezoelectric actuator PZT, approximately double the level of the supply voltage can be generated across the charging inductor $L_1$. This voltage is supplied to the PZT, causing the PZT to expand in a longitudinal direction. When another trigger pulse is input to a gate $G_2$ of the discharging thyristor $S_2$, the discharging thyristor $S_2$ is turned "on" and the PZT is discharged through the discharging inductor $L_2$. The PZT then contracts to its original thickness.

There are, however, some disadvantages in the use of this method. Due to the large amount of energy that needs to be generated, a large inductance and capacitance are required to double the voltage value. Large inductance and capacitance values are undesirable because of the large amount of space that the inductor and capacitor require. As shown, the conventional circuit design uses an additional inductor and capacitor in the discharge path to release energy from the actuator and for energy recovery. These components add to the space occupied by the driver circuit and increase the cost of the driver circuit.

In another example, European Patent Application No. 324450 filed in Jan. 11, 1989 to Masaki Mitsuyasu et al., discloses an LC resonant circuit for driving a piezoelectric element for a fuel injection system. In Mitsuyasu's device the piezoelectric actuator is used as the charging capacitance to complete the LC circuit. Therefore, a charging capacitor is not needed. However, the capacitance value in a piezoelectric actuator varies as much as 50% from the nominal value. Since the charging current increases linearly with the piezoelectric actuator's capacitance value in a resonant circuit, control of the charging current in Mitsuyasu's design becomes difficult. Additionally, when charging resonantly, the voltage attempts to ring down after achieving a peak value. Variations in the the voltage across the actuator cause the actuator to expand and then contract in an erratic manner resulting in imperfect control of the fuel injection cycle. Also, energy is wasted by discharging the actuator to ground without recovering some of the energy released by the actuator.

A suitable piezoelectric driving apparatus is preferably a constant current device, of simple and rugged construction, and capable of functioning with multiple piezoelectric actuators with little increase in expense or complexity. The present invention is directed to overcoming one or more of the problems as set forth above.

DISCLOSURE OF THE INVENTION

In one aspect of the present invention, an apparatus is provided for driving a piezoelectric actuator in response to charge and discharge command signals including an energy source for supplying electrical energy to the piezoelectric actuator. The driving apparatus has a first switch for controllably connecting and disconnecting the energy source to and from the piezoelectric actuator in response to receiving respective charging control signals, and a second switch for controllably connecting and disconnecting the piezoelectric actuator to and from ground in response to receiving respective discharging control signals. Provided is a charging circuit for receiving the charge command signal, sensing the magnitude of the charging current delivered to and the voltage across the piezoelectric actuator, and producing a pulse modulated charging control signal in response to the voltage across the piezoelectric actuator being less than a predetermined upper magnitude. In the preferred embodiment, the pulse modulated charging control signal has a duty cycle responsive to the magnitude of the sensed current. A discharging circuit for receiving the discharge command signal, sensing the magnitude of the discharging current delivered from and the voltage across the piezoelectric actuator, and producing the discharging control signal in response to the voltage across the piezoelectric actuator being greater than a lower predetermined magnitude is also provided.

In another aspect of the invention, a method for driving a piezoelectric actuator in response to charge and discharge command signals including an energy source for supplying electrical energy to the piezoelectric actuator. The method includes the steps of controllably connecting and disconnecting the energy source to and from the piezoelectric actuator in response to receiving a charging control signal, controllably connecting and disconnecting the piezoelectric actuator to and from ground in response to receiving a discharging control signal. The method also includes receiving the charge command signal, sensing the magnitude of the charging current delivered to and the voltage across the piezoelectric actuator, and producing a pulse modulated charging control signal in response to the voltage across the piezoelectric actuator being less than a predetermined upper magnitude, where the pulse modulated charging control signal has a duty cycle responsive to the magnitude of the sensed current. The method further includes receiving the discharge command signal, sensing the magnitude of the discharging current delivered from and the voltage across the piezoelectric actuator, and producing the discharging control signal in response to the voltage across the piezoelectric actuator being greater than a lower predetermined magnitude.

The present invention provides an accurate manner of controlling one or more piezoelectric actuators in an energy and space efficient manner utilizing simple, rugged, and low cost components.

BRIEF DESCRIPTION OF THE DRAWINGS

FIG. 2 is a block diagram of an embodiment the present invention;

FIG. 4 is a detailed schematic diagram of an the embodiment of the invention illustrated in FIG. 2.

BEST MODE FOR CARRYING OUT THE INVENTION

Figure 1:
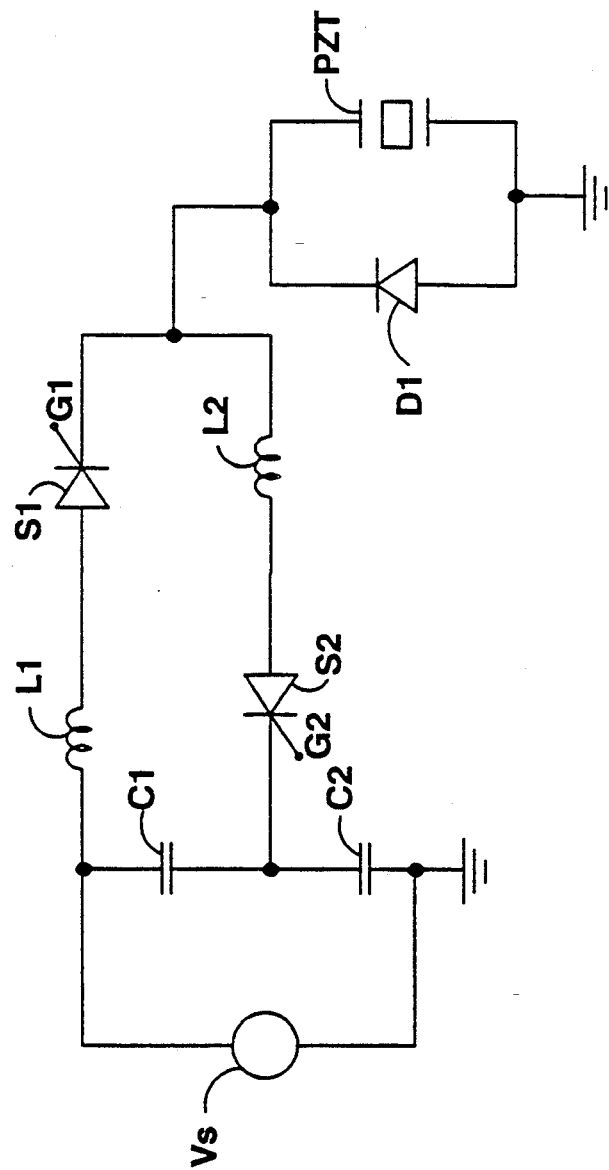
FIG. 1 is an electrical schematic of a conventional drive circuit for an piezoelectric actuator.

Referring now to the drawings, and especially to FIG. 2, a preferred embodiment of the present apparatus 200 is shown. The apparatus 200 is designed to controllably operate at least one piezoelectric actuator 205.

For the purposes of this application, a piezoelectric actuator 205 is defined as a plurality of pellet type piezoelectric elements laminated in the form of a cylinder. Usually, a type of ceramic is used as the piezoelectric element. This piezoelectric element has an important feature that makes it widely utilized for mechanical-electrical conversion or electrical-mechanical conversion. That is, when an electric field is applied in a longitudinal direction to a piezoelectric element, the thickness of the element is rapidly expanded by a small amount. Conversely, when the electric field is removed, the thickness of the element is rapidly contracted to the original state. The piezoelectric actuator 205 is, for example, a portion of a fuel injection device. The movement of a fuel injection valve can be controlled in response to this expansion and contraction so that the fuel injection timing and quantity also can be controlled by the movement of the piezoelectric actuator 205.

The apparatus 200 includes an energy source 210 for supplying electrical energy to the piezoelectric actuator 205 in response to charge and discharge command signals supplied by an external electronic controlling device 213 responsive to a variety of engine operating parameters. Typically the charge and discharge command signals are externally generated injection pulses which are time duration dependent upon the desired quantity of fuel to be delivered to the individual cylinders of a multicylinder engine (not shown). Generation of the injection pulse in not considered to be part of the instant invention and is therefore not described or shown herein, other than to indicate that it is delivered to the apparatus 200. The energy source 210 is typically a high power energy source which delivers energy in the form of direct current.

The apparatus 200 includes a first switching means 215 for controllably connecting and disconnecting the energy source 210 to and from the piezoelectric actuator 205 in response to receiving respective charging control signals, and a second switching means 220 for controllably connecting and disconnecting the piezoelectric actuator 205 to and from ground in response to receiving respective discharging control signals. In the preferred embodiment, the first switching means 215 includes a first semiconductor switch 225 which is a conventional n-channel MOSFET type transistor and is of a construction similar to that supplied by Motorola as part number MTP 3N80. Similarly, the second switching means 220 includes a second semiconductor switch 230 which is also a conventional n-channel MOSFET type transistor and is of a construction similar to that of the first semiconductor switch 225.

The apparatus 200 also includes a charging means 235 for receiving the charge command signal, sensing the magnitude of the charging current delivered to and the voltage across the piezoelectric actuator 205, and producing a pulse modulated charging control signal in response to the voltage across the piezoelectric actuator 205 being less than a predetermined upper magnitude, the pulse modulated charging control signal having a duty cycle responsive to the magnitude of the sensed current, wherein the duty cycle of the charging control signal is responsive to the magnitude of the sensed current respectively falling below and rising above a preselected value. In the preferred embodiment, the upper predetermined magnitude is equivalent to the magnitude of the energy source 210.

A discharging means 240 receives the discharge command signal, senses the magnitude of the discharging current delivered from and the voltage across the piezoelectric actuator 205, and produces the discharging control signal in response to the voltage across the piezoelectric actuator 205 being greater than a lower predetermined magnitude. The discharging control signal is a pulse modulated signal having a duty cycle responsive to the magnitude of the sensed current. In the preferred embodiment, the lower predetermined magnitude is equivalent to the absence of electrical energy.

Figures 3A, 3B:
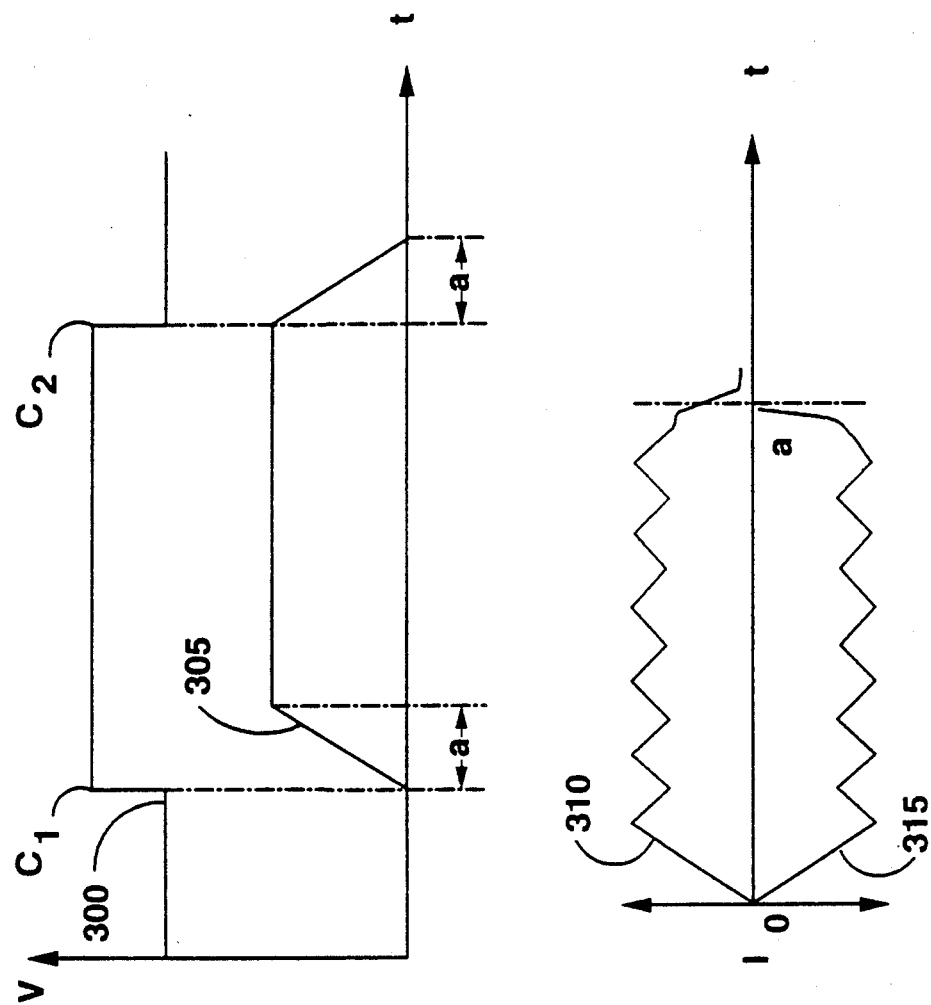
FIGS. 3A and 3B are a graphical representation of a group of electrical waveforms associated with the block diagram of the embodiment for FIG. 2.

The waveforms 300, 305, 310, 315 illustrated in FIGS. 3A and 3B are helpful in understanding the operation of the apparatus 200. Note that the dimensions are not scaled and are for illustration purposes only. The first waveform 300 shows a graphical representation of the injection pulse. The charge and discharge command signals are illustrated as $C_1$ and $C_2$ respectively. The second waveform 305 shows the level of voltage across the piezoelectric actuator 205 during the charge and discharge sequence. As shown, the voltage across the piezoelectric actuator 205 is substantially constant between the charge and discharge command signal. The third waveform 315 shows the charging current flowing to the piezoelectric actuator 205 versus time. FIG. 3b shows the discharging current flowing from the piezoelectric actuator verses time. The letter "a" denotes the charge and discharge time and is inconsequential compared to the duration of time of the injection pulse. In the preferred embodiment, the charging and discharging currents are trapezoidal and approximate a constant current to rapidly charge the piezoelectric actuator 205 to a voltage level corresponding to the upper predetermined magnitude and similarly discharge the piezoelectric actuator to a voltage level corresponding to the lower predetermined magnitude in a manner that gives accurate control of the piezoelectric actuator 205.

Adverting back to FIG. 2, the apparatus further includes a smoothing means 245 for limiting the rate of change of the charging and discharging current. Electrical energy flows from the smoothing means 245 to the energy source 210 through the first switching means 215 in response to both the first and second switching means 215, 220 being deenergized and the piezoelectric actuator 205 being discharged. Additionally, the smoothing means 245 includes an inductor 250 connected between the first switching means 215 and the piezoelectric actuator 205.

The first semiconductor switch 225 is connected between the energy source 210 and the inductor 250, and is adapted to receive the charging control signals. The first semiconductor switch 225 has a drain connected to the energy source 210, a source connected to the inductor 250, and a gate connected to an output terminal of the charging means 235. Additionally, the source of the first semiconductor switch 225 is also connected to an output terminal of the charging means 235. Inherent in this MOSFET construction is a "parasitic" diode (not shown) with an anode connected to the source and a cathode connected to the drain. The ratings of the diode are the same as that of the MOSFET. This diode is an important circuit element because it allows for energy recovery. Typically, energy stored in the magnetic field of the inductor 250 is passed through the first semiconductor switch 225 and is returned to the energy source 210 to be reused during the next injection cycle.

The second semiconductor switch 230 is connected between the juncture of the first semiconductor switch 225 to the inductor 250 and ground, the second semiconductor switch 230 being adapted to receive the discharging control signals. More particularly, the second semiconductor switch 230 has a source connected to ground, a drain connected to the juncture of the first semiconductor switch 225 to the inductor 250, and a gate connected to the discharging means.

Referring now to FIG. 4, the charging means 235 includes a first comparator 405, a second comparator 410, a first AND gate 415, and a gate drive unit 420. A sensing resistor 425 is connected between the piezoelectric actuator 205 and ground. The connection between the piezoelectric actuator 205 and the sensing resistor 425 is provided at an inverting terminal of the first comparator 405, which receives a signal representing the magnitude of the charging current delivered to the piezoelectric actuator 205. A first proportionating resistor 430 is connected between the non-inverting terminal and a voltage source $V_1$. The first proportionating resistor 430 essentially provides a preselected value to the first comparator 405 in accordance with the present invention as will be subsequently discussed. An output terminal of the first comparator 405 is connected to the first AND gate 415.

A connection between the inductor 250 and the piezoelectric actuator 205 is provided at an inverting terminal of the second comparator 410 via a first voltage divider network 413. The first voltage divider network 413 gives a value proportional to the voltage across the actuator 205. A first scaling resistor 440 is connected between a non-inverting terminal of the second comparator 410 and a voltage source $V_2$. So configured, the first scaling resistor 440 ensures that a voltage level which is proportional to the magnitude of the energy source 210 is always applied to the non-inverting input of the second comparator 410. An output terminal of second comparator 410 is connected to a charging summing junction 446 which connects the first comparator 405 to the first AND gate 415. A first pullup resistor 447 is connected between a voltage source $V_3$ and the charging summing junction 446, which connects output terminals of the first and second comparators 405, 410. Consequently, the charging summing junction 446 produces a "high" signal in response to both first and second comparators 405,410 producing a "high" signal. In the preferred embodiment, all of the comparators discussed are contained in a quad package, are configured in a similar manner that is well known in the art, and are constructed similar to the comparators supplied by Motorola as part number LM139.

The first AND gate 415 is constructed as an integrated circuit similar to that supplied by Motorola as part number 74HC08 having one input terminal connected to the charging summing junction 446 and one input terminal adapted to receive the charge command signals. The output terminal of the first AND gate 415 is connected to the gate drive unit 420. So configured, the first AND gate 415 only provides an enabling output signal to the gate drive unit 420 in the presence of both the charge command signal and a "high" output signal from the charging summing junction 446. The gate drive unit 420 is connected between the first AND gate 415 and the gate of the first semiconductor switch 225, and also is connected to the source of the first semiconductor switch 225. Essentially, the gate drive unit 420 "drives" the first semiconductor switch 225. Such gate drive units 420 are well understood in the art, and a detailed description of the gate drive unit 420 is not provided here.

The discharging means 240 includes a third comparator 455, a fourth comparator 460, and a second AND gate 465. The third comparator 455 detects the discharging current produced by the piezoelectric actuator 205. A non-inverting terminal of the third comparator 455 is connected between the piezoelectric actuator 205 and the sensing resistor 425 via a second voltage divider network 467. Additionally, the second voltage divider network 467 is connected to a voltage source V and the second voltage divider network 467 delivers a signal representing the magnitude of the discharging current to the third comparator 455. A second scaling resistor 470 is connected between the inverting terminal and the voltage source $V_1$. The second scaling resistor 470 provides a preselected value to the third comparator 455. The output terminal of the third comparator 455 is connected to the second AND gate 465. The fourth comparator 460 detects the voltage across the piezoelectric actuator 205. A non-inverting terminal of the fourth comparator 460 is connected between the inductor 250 and the piezoelectric actuator 205 via a third voltage divider network 487. Additionally, the third voltage divider 487 network provides a voltage proportional to the voltage across the piezoelectric actuator 205 and delivers this voltage to the fourth comparator 460. A second proportioning resistor 485 is connected between the inverting terminal and a voltage source $V_4$. Typically, the voltage source $V_4$ is a low power energy source. So configured, the second proportioning resistor 485 ensures that at least a minimum voltage level is always applied to the inverting input of the fourth comparator 460. The output terminal of the fourth comparator is connected to a discharging summing junction 488. The discharging summing junction 488 connects the output terminals of the third and fourth comparators 455, 460 to the second AND gate 465. A second pullup resistor 489 is connected between the voltage source $V_3$ and the discharging summing junction 488. In the preferred embodiment, the discharging summing junction 488 only produces a "high" signal in response to both the third and fourth comparators 455, 460 producing a "high" signal. The second AND gate 465 is similar in construction to that of the first AND gate 415, having one input terminal connected to the discharging summing junction 488 and one input terminal connected to receive the discharge command signals. The discharge command signals are inverted by an inverter 469 which is connected to an input terminal of the second AND gate 465 and is adapted to receive the discharge command signal. The output terminal of the second AND gate 465 is connected to the gate of the second semiconductor switch 230. So configured, the second AND gate 465 only provides an enabling output signal to the second semiconductor switch 230 in the presence of both the discharge command signal and a "high" output signal from the discharging summing junction 488.

A diode 475 with a cathode connected between the inductor 250 and the piezoelectric actuator 205, and an anode connected to ground. The diode 475 is used for clamping abnormal voltage due to a reversing electric field.

INDUSTRIAL APPLICABILITY

In the overall operation of the apparatus 200, assume that the charge and discharge command signals are being supplied to the piezoelectric driver circuit by an external electronic control device 213 responsive to a variety of engine operating parameters.

Typically, an injection pulse is generated by the electronic control device 213; consequently, the charge command signal is delivered to the charging means 235, and the first AND gate 415 receives the charge command signal. Referring to the first waveform 300, the charge command signal is the upper portion of the injection pulse denoted by $C_1$. For example, in this particular instance assume that the output terminals of the first and second comparators 405, 410 produce a "high" signal enabling the first AND gate 415, which responsively produces a "high" signal. The gate drive unit 420 receives the "high" signal produced by the first AND gate 415 and responsively biases the first semiconductor switch 225 to the "on" state. This condition of the first semiconductor switch 225 electrically connects the piezoelectric actuator 205 to the energy source 210. Current begins to flow through the inductor 250, increasing exponentially, charging the piezoelectric actuator 205.

The first comparator 405 monitors the current flowing to the piezoelectric actuator 205. For example, the voltage imposed across the current sensing resistor 425 is proportional to the current flowing through the piezoelectric actuator 205. Since the resistance of the current sensing resistor 425 is known, a voltage which is proportional to the charging current is determined by applying Ohm's law.

The charging current continues to increase until the current reaches a preselected value. Therefore, when the voltage on the inverting input of the first comparator 405 rises above the preselected value imposed on the non-inverting terminal of the first comparator 405, then the output terminal produces a "low" signal to the first AND gate 415 Which responsively delivers a "low" signal to the gate drive unit 420. Correspondingly, the gate drive unit 420 biases the first semiconductor switch 225 "off" and disconnects the piezoelectric actuator 205 from the energy source 210. The charging current then exponentially decays. Once the magnitude of the charging current drops to a level lower than the preselected value, the first comparator 405 again produces a "high" signal to deliver electrical energy to the piezoelectric actuator 205.

The charging current continues to oscillate until the voltage across the piezoelectric actuator 205 reaches an upper predetermined magnitude which is equivalent to the voltage level of the energy source 210. The charging current approximates a constant current (shown in the third waveform 310) which builds the voltage across the piezoelectric actuator 205 at a controlled rate. In the preferred embodiment, the inductor 250 is primarily used to control the rate of change of the current, and smooth the oscillating waveform, better approximating a constant current. Additionally, charging the piezoelectric actuator 205 at a controlled rate is necessary to provide an even displacement of the individual ceramic disks which comprise the piezoelectric actuator 205, and to also limit the maximum currents, hence providing for a low power design.

The voltage level built across the piezoelectric actuator 205 is determined by an inverting input of the second comparator 410. The second comparator 410 produces a "high" signal until the reference voltage delivered to the non-inverting terminal is exceeded by the voltage level on the inverting terminal. The reference voltage is proportional to the magnitude of the energy source 210, which is representative of the upper predetermined magnitude.

The second waveform 305 illustrates that the voltage across the piezoelectric actuator 205 is "flat" corresponding to an even displacement of the piezoelectric actuator 205 during the entire injection pulse.

At the end of the injection pulse a discharge command signal is delivered to the discharging means 240, and the second AND gate 465 receives the inverted discharge command signal. Referring to the first waveform 300, the discharge command signal is the lower portion of the injection pulse denoted by $C_2$.

The discharging means 240 behaves in a similar manner to the charging means 235. For example, when the discharge command signal is received assume that the output terminals of the third and fourth comparators 455, 460 produce a "high" signal enabling the second AND gate 465. The gate of the second semiconductor switch 230 receives the "high" signal produced by the second AND gate 465 and is responsively biased to the "on" state. This condition of the second semiconductor switch 230 electrically connects the piezoelectric actuator 205 to ground. Current then begins to flow through the inductor 250 from the piezoelectric actuator 205 and to ground. Correspondingly, the third comparator 455 monitors the discharging current. The third comparator 455 operates identically to the first comparator 405. In this case however, the discharging current is in an opposite orientation with respect to the charging current, but the discharging current is discussed with reference to the magnitude only.

When the voltage applied to the non-inverting input of the third comparator 455 exceeds the preselected value imposed on the inverting terminal, the output terminal delivers a "low" signal to the second AND gate 465. Correspondingly, the second AND gate 465 biases the second semiconductor switch 230 "off" and disconnects the piezoelectric actuator 205 from ground. The discharging current then decays to a level lower than the preselected value; and, once again, the third comparator 455 produces a "high" signal to allow electrical energy stored in the piezoelectric actuator 205 to be released to ground. The discharging current continues to oscillate until the charge of the piezoelectric actuator 205 reaches a lower predetermined magnitude.

The voltage level of the piezoelectric actuator 205 is determined by the fourth comparator 460. The fourth comparator 460 produces a "high" signal until the voltage across piezoelectric actuator 205 imposed on the non-inverting terminal drops below the reference voltage delivered to the inverting terminal of the fourth comparator 460.

Significant energy savings result from the operation of the first switching means 215. When the piezoelectric actuator 205 is discharging, the first semiconductor switch 225 is "off" due to the absence of a charge command signal. Also, the second semiconductor switch 230 is alternating between "on" and "off" states due to the discharging current rising above and below a preselected value. Due to the transfer of energy from the piezoelectric actuator to the inductor 250 when the second semiconductor switch 239 is "on", a large amount of magnetic energy is stored in the inductor. Since a diode is inherent in the construction of the first semiconductor switch 225, the diode is biased "on" when both semiconductor switches 225, 230 are deenergized, and electrical energy is released from the magnetic field stored in the inductor 250 through the diode to the energy source 210 where energy is recovered. This allows for a substantial amount of energy savings.

Other aspects, objects, and advantages can be obtained from a study of the drawings, the disclosure, and the appended claims.

We claim:

1. An apparatus for driving a piezoelectric actuator in response to charge and discharge command signals, including an energy source for supplying electrical energy to said piezoelectric actuator, comprising:

first switching means for controllably connecting and disconnecting said energy source to and from said piezoelectric actuator in response to receiving respective charging control signals;

second switching means for controllably connecting and disconnecting said piezoelectric actuator to and from ground in response to receiving respective discharging control signals;

charging means for receiving said charge command signal, sensing the magnitude of the charging current delivered to and the voltage across said piezoelectric actuator, and producing a pulse modulated charging control signal in response to the voltage across said piezoelectric actuator being less than a predetermined upper magnitude, said pulse modulated charging control signal having a duty cycle responsive to the magnitude of said sensed current; and discharging means for receiving said discharge command signal, sensing the magnitude of the discharging current delivered from and the voltage across said piezoelectric actuator, and producing said discharging control signal in response to the voltage across said piezoelectric actuator being greater than a lower predetermined magnitude.

2. An apparatus, as set forth in claim 1, wherein the duty cycle of said charging control signal is responsive to the magnitude of said sensed current respectively falling below and rising above a preselected value.

3. An apparatus, as set forth in claim 1, wherein said discharging control signal is a pulse modulated signal having a duty cycle responsive to the magnitude of said sensed current.

4. An apparatus, as set forth in claim 1, including a smoothing means for limiting the rate of change of the charging and discharging current.

5. An apparatus, as set forth in claim 4, wherein electrical energy flows from said smoothing means to said energy source through said first switching means in response to both of said first and second switching means being deenergized and said piezoelectric actuator being discharged.

6. An apparatus, as set forth in claim 4, wherein said smoothing means includes an inductor connected between said first switching means and said piezoelectric actuator.

7. An apparatus, as set forth in claim 6, wherein said first switching means includes a first semiconductor switch connected between said energy source and said inductor, said first semiconductor switch being adapted to receive said charging control signals.

8. Apparatus, as set forth in claim 7, wherein said second switching means includes a second semiconductor switch connected between the juncture of said first semiconductor switch to said inductor and ground, said second semiconductor switch being adapted to receive said discharging control signals.

9. An apparatus, as set forth in claim 1, wherein the voltage across said piezoelectric actuator is substantially constant between said charge and discharge command signal.

10. A method for driving a piezoelectric actuator in response to charge and discharge command signals including an energy source for supplying electrical energy to said piezoelectric actuator, comprising the steps of:

controllably connecting and disconnecting said energy source to and from said piezoelectric actuator in response to receiving respective charging control signals;

controllably connecting and disconnecting said piezoelectric actuator to and from ground in response to receiving respective discharging control signals;

receiving said charge command signal, sensing the magnitude of the charging current delivered to and the voltage across said piezoelectric actuator, and producing a pulse modulated charging control signal in response to the voltage across said piezoelectric actuator being less than a predetermined upper magnitude, said pulse modulated charging control signal having a duty cycle responsive to the magnitude of said sensed current; and receiving said discharge command signal, sensing the magnitude of the discharging current delivered from and the voltage across said piezoelectric actuator, and producing said discharging control signal in response to the voltage across said piezoelectric actuator being greater than a lower predetermined magnitude.

11. A method, as set forth in claim 10, wherein the duty cycle of said charging control signal is responsive to the magnitude of said sensed current respectively falling below and rising above a preselected value.

12. A method, as set forth in claim 10, wherein said discharging control signal is a pulse modulated signal having a duty cycle responsive to the magnitude of said sensed current.

13. An apparatus for driving a piezoelectric actuator in response to charge and discharge command signals, including an energy source for supplying electrical energy to said piezoelectric actuator, comprising:

first switching means for controllably connecting and disconnecting said energy source to and from said piezoelectric actuator in response to receiving respective charging control signals; and charging means for receiving said charge command signal, sensing the magnitude of the charging current delivered to and the voltage across said piezoelectric actuator, and producing a pulse modulated charging control signal in response to the voltage across said piezoelectric actuator being less than a predetermined upper magnitude, said pulse modulated charging control signal having a duty cycle responsive to the magnitude of said sensed current.

14. An apparatus, as set forth in claim 13, wherein the duty cycle of said charging control signal is responsive to the magnitude of said sensed current respectively falling below and rising above a preselected value.

15. An apparatus, as set forth in claim 13, including a discharging means for receiving said discharge command signal, sensing the magnitude of the discharging current delivered from and the voltage across said piezoelectric actuator, and producing said discharging control signal in response to the voltage across said piezoelectric actuator being greater than a lower predetermined magnitude.

16. An apparatus, as set forth in claim 15, including a second switching means for controllably connecting and disconnecting said piezoelectric actuator to and from ground in response to receiving respective discharging control signals.

17. An apparatus, as set forth in claim 15, wherein said discharging control signal is a pulse modulated signal having a duty cycle responsive to the magnitude of said sensed current.

18. A method for driving a piezoelectric actuator in response to charge and discharge command signals including an energy source for supplying electrical energy to said piezoelectric actuator, comprising the steps of:

controllably connecting and disconnecting said energy source to and from said piezoelectric actuator in response to receiving respective charging control signals; and receiving said charge command signal, sensing the magnitude of the charging current delivered to and the voltage across said piezoelectric actuator, and producing a pulse modulated charging control signal in response to the voltage across said piezoelectric actuator being less than a predetermined upper magnitude, said pulse modulated charging control signal having a duty cycle responsive to the magnitude of said sensed current.

19. A method, as set forth in claim 18, wherein the duty cycle of said charging control signal is responsive to the magnitude of said sensed current respectively falling below and rising above a preselected value.

20. A method, as set forth in claim 18, including the step of controllably connecting and disconnecting said piezoelectric actuator to and from ground in response to receiving respective discharging control signals.

21. A method, as set forth in claim 20, including the step of receiving said discharge command signal, sensing the magnitude of the discharging current delivered from and the voltage across said piezoelectric actuator, and producing said discharging control signal in response to the voltage across said piezoelectric actuator being greater than a lower predetermined magnitude.

22. A method, as set forth in claim 21, wherein said discharging control signal is a pulse modulated signal having a duty cycle responsive to the magnitude of said sensed current.

* * * * *